United States Patent [19]

Lanam et al.

[11] 4,444,728

[45] Apr. 24, 1984

[54] IRIDIUM-RHENIUM CRUCIBLE

[75] Inventors: Richard D. Lanam, Westfield; Allen R. Robertson, Edison; Edward D. Zysk, Livingston, all of N.J.

[73] Assignee: Engelhard Corporation, Iselin, N.J.

[21] Appl. No.: 341,422

[22] Filed: Jan. 21, 1982

[51] Int. Cl.³ .................................................. C30B 15/10
[52] U.S. Cl. ............................... 422/249; 156/DIG. 83
[58] Field of Search .................. 156/617 SP, DIG. 83; 422/248, 249; 432/262; 164/335; 420/461

[56] References Cited

U.S. PATENT DOCUMENTS 3,463,636  8/1969  Ogren .................................. 420/461

FOREIGN PATENT DOCUMENTS

51-43399  4/1976  Japan .......................... 156/DIG. 83

Primary Examiner—Hiram H. Bernstein

[57] ABSTRACT

A crucible for preparing a single crystal which comprises an iridium-rhenium alloy comprised of from about 80 to about 99 parts of iridium and from about 1 to about 20 parts of rhenium. The crucible has excellent creep resistance and compatability properties and is especially useful for the preparation of gadolinium-gallium-garnet crystal.

5 Claims, 6 Drawing Figures

IRIDIUM-RHENIUM CRUCIBLE

BACKGROUND OF THE INVENTION

1. Field of the Invention

This invention relates to a crucible having superior creep resistance and comprised of an iridium-rhenium alloy, and to a process for growing a crystal, such as a gadolinium-gallium-garnet crystal, in such crucible, and to a process for preparing such a crucible.

2. Description of the Prior Art (a) Defect-Free Gadolinium-Gallium Garnet

Magnetic bubbles are tiny, cylindrical, magnetized areas on computer chips. They are usually contained in several micrometer-thick films of garnet material. Such bubbles can be moved around electronically so that they can be used for computing and for storing memory.

In a typical magnetic bubble domain storage device, there are at least two layers of material: a gadolinium-gallium-garnet substrate layer, and, on top of the substrate layer, a bubble formation layer. See "Bubble Storage Density Increases Fourfold", Industrial Research/Development, May, 1979, pages 45-46.

The bubble domain storage devices must be defect-free. A defect in a magnetic bubble film is anything which will stop or deflect a bubble. Defects include magnetic particles in the film, cracks, scratches, pits, grain boundaries, and dislocations in the crystal structure. A defect-free film must be a nearly perfect, dislocation-free single crystal; and this means that a nearly perfect, dislocation-free substrate is required to support the film.

Single-crystal magnetic garnet films can be deposited only on other garnet single crystals by a process called epitaxy (the growth of one crystal upon another). The substrate garnet crystal must be transparent so that bubbles in the film can be seen for testing purposes. The lattice structure of the substrate must be as near in size as possible to that of the film so that the substrate and film can join to form a coherent interface. One of the few substrates which meets these requirements is gadolinium-gallium-garnet. Levinstein et al., Bell Laboratories Record, July/August 1973, pages 209-214.

Impurities in the gadolinium-gallium-garnet crystal tend to stop or deflect the magnetic bubbles of the bubble domain device and limit the usefulness of the garnet in said device. Consequently, it is important to use a crucible during the growth of the gadolinium-gallium-garnet crystal which is compatible with and does not contribute impurities to the crystal melt.

(b) The Use of Iridium Crucibles to Grow Gadolinium-Gallium-Garnet

Gallium oxide and gadolinium oxide can be charged to an iridium crucible in order to form a melt from which a gadolinium-gallium-garnet crystal can be pulled. The gallium oxide is a reactive component, and it tends to react with the iridium crucible. Thus, for example, when gadolinium-gallium-garnet crystal is grown at a temperature of 1725° C. using a 90 volume percent nitrogen/10 volume percent oxygen ambient gas, iridium losses of from 0.5 to 1.0 grams per hour have been recorded. B. Cockayne, Czochralski Growth of Oxide Single Crystals, Platinum Metals Review, Vol. 18, July, 1974, pages 86-91.

(c) Crucible Creep

U.S. Pat. No. 3,210,167 discloses that crucible creep is a physical action which occurs in a crucible at high temperatures and under the prolonged action of small forces; under these conditions, a progressive deformation of the crucible occurs which eventually is followed by the appearance of cracks. One of the reasons creep occurs is because of the corrosive action of oxygen which is present in and around the crucible when it is used to heat molten materials to high temperatures.

When an iridium crucible is used in an oxidizing atmosphere, creep is caused by the preferential oxidation of iridium at the grain boundaries. Some of the iridium oxide formed may be lost to the crystal melt, and the crucible is weakened by the loss of the material comprising it. Furthermore, even those particles of iridium oxide which remain on the crucible impart less strength to the crucible than do iridium particles.

A crucible consisting of a metal which has a poorer oxidation resistance than iridium should suffer substantially higher metal losses under high temperature oxidizing conditions and, thus, should be more prone to suffer from creep than an iridium crucible.

(d) The Oxidation Resistance of Rhenium

The oxidation resistance of the refractory noble metals, such as rhenium, ruthenium, iridium, rhodium, platinum, and palladium, ranges from among the best that is known (that characterized by rhodium) to the worst known (that of rhenium). The mechanism of oxidation of the noble metals involves the formation of a volatile oxide and metal loss due to oxide vaporization and metal vaporization at temperatures above the oxide decomposition temperature. At temperatures below the oxide decomposition temperature, a stable oxide film is formed. The decomposition temperature (the temperature at which the dissociation pressure of the solid oxide equals 1 atmosphere) of iridium oxide is 1100° C. One of the rhenium oxides, $ReO_3$, melts at 160° C. and disproportionates to $ReO_2$ and $Re_2O_7$. $Re_2O_7$ melts at 296° C. Refractory Metals and Alloys, Met. Soc. Conf. (Interscience, New York, 1961), Vol. 1, pp. 407-409.

A comprehensive study of rhenium alloys is presented in Savitskii et al., Rhenium Alloys, IPST Cat. No. 551 (Israel Program for Scientific Translations, Ltd., Jerusalem, 1970), available from the U.S. Department of Commerce, Clearinghouse for Scientific and Technical Information, Springfield, Va., publication TT 69-55081. Savitskii et al. disclose that rhenium is characterized by ". . . rapid disintegration due to intense oxidation at high temperatures . . . " that, when ". . . heated above 600° C. rhenium reacts vigorously with oxygen to form rhenium heptoxide . . . " (page 343), and that ". . . the oxidation of rhenium at the grain boundaries on heating in air causes intergranular failure during hot working . . . " (page 345).

It is an object of this invention to provide a crucible useful for the preparation of gadolinium-gallium-garnet crystals which has superior compatability and creep resistance properties. It is another object of this invention to provide a process for the preparation of said crystals which produces a substantially defect-free crystal with little or no crucible deformation.

SUMMARY OF THE INVENTION

A crucible consisting essentially of an alloy of iridium and rhenium, wherein said alloy is comprised of from about 85 to about 99 weight percent of iridium and from about 1 to about 15 weight percent of rhenium, and a process for growing a crystal in said crucible.

BRIEF DESCRIPTION OF THE DRAWINGS

The present invention will be more fully understood by reference to the following detailed description thereof, when read in conjunction with the attached drawings, wherein like reference numerals refer to like elements and wherein.

DESCRIPTION OF THE PREFERRED EMBODIMENTS

An Iridium-Rhenium Alloy Crucible

The iridium-rhenium alloy used to produce the crucible of this invention is comprised of from about 85 to about 99 weight percent of iridium and from about 1 to about 15 weight percent of rhenium. It is preferred that said alloy be comprised of from about 90 to about 95 weight percent of iridium and from about 5 to about 10 weight percent of rhenium.

In one preferred embodiment, the iridium-rhenium alloy used to produce the crucible of this invention consists essentially of from about 85 to 99 weight percent of iridium and from about 1 to about 15 weight percent of rhenium; it is preferred that said alloy consist essentially of from about 90 to about 95 weight percent of iridium and from about 5 to about 10 weight percent of rhenium.

The alloy used to prepare the crucible of this invention has a melting point of from about 2450° to about 2515° C.

PREPARATION OF THE IRIDIUM-RHENIUM ALLOY

The iridium-rhenium alloy can be prepared by means well known to those skilled in the art. In one process, from about 85 to about 99 parts by weight of iridium powder and from about 1 to about 15 parts by weight of rhenium powder are mixed, the powder mixture is compacted at a pressure of from about 5,000 to about 60,000 pounds per square inch, and the powder mixture is sintered in vacuum or air at a temperature of from about 1400° to about 2400° C. and, more preferably, at a temperature of from about 1600° to about 1800° C. In a preferred embodiment, the powder mixture is compacted at a pressure of from about 20,000 to about 30,000 p.s.i. The mixing, compacting, and sintering techniques known to those in the art can be used to prepare said iridium-rhenium alloy. Thus, for example, one can utilize the powder mixing, molding, compressing under heat, and sintering techniques, described in Goetzel's "Treatise on Powder Metallurgy", Vol. 1 (Interscience Publishers, Inc., New York, 1949), the disclosure of which is hereby incorporated by reference.

In another preferred embodiment for preparing said iridium-rhenium alloy, from about 85 to about 99 parts by weight iridium powder are mixed with from about 1 to about 15 parts of rhenium powder, and then the powder mixture is thermally sintered without compacting at a temperature of from about 1800° to about 2400° C. and preferably from about 2000° to about 2300° C. The thermal sintering techniques known to those skilled in the art, including the techniques described in said "Treatise on Powder Metallurgy" book, can be employed in this embodiment.

The iridium/rhenium powders can be consolidated by either conventional powder metallurgy techniques or by melting. Powder compacts are most preferably sintered in vacuum at 1500° C. prior to forging, rolling, swaging, or other working operations for consolidation. Compacts have also been sintered in an air atmosphere.

In one of the melting embodiments which can be used to consolidate the iridium/rhenium powders, the mixed powders are heated to a temperature of from about 800° to about 1500° C., and preferably to a temperature of from about 1000° to about 1400° C., to degas the mixed powders until their gas content is less than about 5 weight percent. Thereafter, the degassed mixed powders are melted at a temperature of from about 2650° to about 2915° C. and, preferably, at a temperature of from about 2730° to about 2815° C. Melting may be carried out with electron beam heating, in an argon-arc furnace on a water-cooled copper hearth, or by induction heating in a zirconia crucible, again in an argon atmosphere. In each instance, the powder is the raw material, which is preferably first briquetted and vacuum sintered into a partially consolidated material.

Sintered or cast iridium/rhenium has working characteristics similar to those of tungsten and thus requires considerable care in the early stages of processing. Initial breakdown of cast or sintered shapes is done by forging, rolling, or swaging in the temperature range 1100°–1600° C. and, preferably, 1200°–1500° C.

Subsequent drawing to wire is performed by "warm working" at 500°–1100° C. and, preferably, 600°–750° C., which is below the recrystallization temperature. Such wire has a fibrous structure, and preferably a hardness of 600–700 DPH (diamond pyramid hardness) and useful tensile strength and ductility. Drawing at lower temperatures leads to a rapid increase in hardness and splitting of the wire. Drawing of material that has been fully recrystallized by annealing results in frequent breakage.

Iridium/rhenium may be rolled at 500°–1100° C., and, preferably, 600°–750° C., into strip with the fibrous structure characteristic of drawn wire. In addition, iridium/rhenium may be rolled at higher temperatures of 1000°–1500° C. and, preferably, 1200°–1500° C. to yield a product with an equiaxed structure and hardness of about 400 DHP. In general, worked material which has a fibrous structure is preferred since it has better ductility and strength.

"Warm-worked" iridium/rhenium does not exhibit a sharp recrystallization temperature. Some softening occurs on heat treatment at 700° C., but it is necessary to heat to 1000° C., or higher before full recrystallization occurs.

PREPARATION OF THE IRIDIUM/RHENIUM ALLOY CRUCIBLE

The iridium/rhenium alloy can be fabricated into the crucible of this invention by means well known to those skilled in the art. Thus, for example, the alloy can be melted by being subjected to a temperature of from about 2450° to about 2850° C., rolled into a strip, formed into a cylindrical crucible shape, and welded. Thus, e.g., the fabricating techniques known to those skilled in the art for fabricating tungsten metal can be used to fabricate the iridium/rhenium alloy into the crucible. Thus, e.g., the rolling techniques described on pages 315-376 of Sachs and Van Horn's "Practical Metallurgy" (The American Society for Metals, Cleveland, Ohio, 1940) can be used to roll the iridium/rhenium alloy.

As used herein, the term "crucible" refers to the container in which the initial oxide powders and later the melt are contained. However, it does not necessarily include other structure for supporting and/or covering said container.

In one embodiment, a sheet of 95% iridium/rhenium is first prepared and then fabricated into a crucible by a process involving (1) forming the sheet into a cylinder of appropriate size (the diameter of the sheet will be the diameter of the crucible), (2) joining the formed cylinder at its seam by an appropriate technique such as, e.g., the tungsten-inert gas welding process using a filler rod with the same composition as the sheet, (3) punching a coupon bottom for the crucible from a second sheet with the same composition as the first sheet, (4) welding the bottom coupon to the joined cylinder by an appropriate technique such as, e.g., the tungsten-inert gas welding process using a filler rod with the same composition as the sheet, and (5) cleaning the crucible to reduce contamination. Care should be taken at all stages of fabrication to reduce potential impurities. Thus, for example, after step (4), the crucible can be etched with aqua regia (or other suitable cleaning reagent) for about 15 minutes.

CRYSTAL GROWTH

The iridium-rhenium crucible of this invention can be utilized to grow crystals by any of the crystal growth techniques known to those skilled in the art. Thus, for example, it can be used to grow crystals from a pure melt with the well-known Bridgman-Stockbarger, Czochralski, Kyryopoulos, and Vermeuil techniques. Thus, e.g., it can be used to grow crystals from solution.

In the Kyropoulos technique, molten material is held in the crucible at a temperature just above its melting point, heat is abstracted through a water-cooled seed, and crystallization occurs on the seed which grows down into the melt. The temperature control of the furnace largely determines the diameter of the growing crystal.

In the Czochralski and other pulling techniques, the melt is held at a temperature just above the melting point and growth occurs by the abstraction of heat through the seed. In the Czochralski technique, the crystal is withdrawn at such a rate that the interface remains in a relatively constant position. The pulling techniques, which are used, e.g., for the growth of silicon and germanium crystals, are basically similar to the Czochralski technique. In these pulling techniques, in order to avoid strains and consequently high dislocation densities, the assembly is carefully designed to give a flat interface, and heat losses by radiation through the sides of the crystal are balanced by additional heating in that region; these techniques can be used, e.g., to grow germanium crystals of up to at least 5 kilograms in weight. The pulling technique can also be used for the production of doped $CaWO_4$ crystals using the crucible of this invention and an inert gas atmosphere; see, e.g., Preziosi, S., Soden, R. R., and Van Uitert, L. G., J. Appl. Phys., 1962, 33, 1893, the disclosure of which is hereby incorporated by reference into this specification.

In the Bridgman-Stockbarger technique, a melt is lowered through a sharp temperature gradient. The crucible used in this technique is shaped with a pointed end in order to limit nucleation. The temperature gradient is generally formed by using separate furnace windings with a baffle plate between them which fits the crucible closely. The process is preferably carried out in a vacuum. Some of the crystals which can be grown with this technique include, e.g., $CaF_2$, spinel-type ferrites, $CaWO_4$, and other alkaline earth halides. See, e.g., Jones, D. A., and Jones, R. V., Proc. Phys. Soc., 1962, 79, 351, the disclosure of which is hereby incorporated by reference herein.

The Stober-Strong crystal growth technique is a variation of a melt technique involving raising a cooled copper block to fit around the cone of a crucible shaped similarly to a Bridgman crucible. The crucible of this invention can be used in this technique.

The crucible of this invention also can be used in zone-melting techniques. In one of these techniques, a long horizontal crucible ("boat") contains the crystal melt; a seed crystal is placed at one end, the molten zone is produced so that the end of the seed projecting into the boat is melted, and the zone is then traversed away from the seed. In one embodiment, the zone is traversed along a vertical rod. In another embodiment, the two ends of the solid rods are rotated in opposite directions during growth; see, e.g., Pfann, W. G., Zone Melting (Wiley & Sons, New York, 1958), the disclosure of which is hereby incorporated by reference herein. A combination of this floating-zone technique and the Czochralski technique is encountered in pedestal melting, where the end of a relatively thick rod is melted (by, e.g., radio frequency heating) and a thinner crystal is pulled from the molten pool.

The crucible of this invention can also be used in the flame fusion or Vermeuil technique wherein a trickle of fine powder is fed into an oxy-hydrogen flame, fusion of the powder occurs, and the molten material falls on the growing crystal. In this technique, crystallization is initiated either by fusing the tip of a cone or unfused powder, or preferably, by using a small piece of seed rod. Crystals which can be grown by this technique include spinels, ferrites, mullite, $Y_2O_3$, $Cr_2O_3$, and the like.

The iridium-rhenium crucible of this invention can also be used with the molten and high-temperature materials of the prior art, such as glasses, salts, and oxides, to prepare single crystals. Thus, by way of illustration and not limitation, one can use the iridium crucible of this invention to prepare sapphire; $\alpha$-$Al_2O_3$; $Al_2SiO_5$; aluminosilicates; alkali halides such as, e.g., $CaF_2$; $BaFe_{12}O_{19}$; $Bi_2Te_3$; $BeO$; $BN$; $C$; $CS$; calcium tungstate ($CaWO_4$); $BaClF$; $Bi_{12}GeO_{20}$; $Fe_3O_4$; metal-$Fe_2O_4$; erbium europium iron gallium garnet ($Er_2EuFe_{4.3}Ga_{0.7}O_{12}$); $GaAs$; $GdGa_5O_{12}$; $Ge$; gadolinium erbium iron gallium garnet ($GdEr_2Fe_{4.3}Ga_{0.7}O_{12}$); $InSb$; $LiNbO_3$; $LiTaO_3$; $MgO$; spinel ($MgAl_2O_4$); $MnFe_2O_4$; NaBa$_2$N-

$b_5O_{12}$; $NaNO_3$; PbF-PbO mixtures; PbTe; organic crystals; Si; SiC; $Si_3N_4$; α-$SiO_2$; $SrTiO_3$; $Sr_{0.5}Ba_{0.5}Nb_2O_6$; $TiO_2$; $ThO_2$; $VO_2$; WC; $Y_3F_5O_{12}$; yttrium samarium iron gallium garnet ($Y_{2.62}Sm_{0.38}Sm_{0.38}Fe_{3.8}Ga_{1.2})_{12}$); yttrium orthoaluminate ($YAlO_3$); ZnS; $ZrSiO_4$; $ZrO_2$; $ZnWO_4$; almandine ($Fe_3Al_2Si_3O_{12}$); andradite ($Ca_3Fe_2Si_3O_{12}$); goldmanite ($Ca_3V_2Si_3O_{12}$); grossular ($Ca_3Al_2Si_3O_{12}$); henritermierite ($Ca_3[Mn,Al]_2Si_2O_8[OH]_4$); hydrogrossular ($Ca_3Al_2Si_2O_8[OH]_4$); Kimzeyite ($Ca_3[Zr,Ti]_2[Al,Si]_3O_{12}$); Knorringite ($Mg_3Cr_2Si_3O_{12}$); majorite ($Mg_3[Fe,Al,Si]_2Si_3O_{12}$); Pyrope ($Mg_3Al_2Si_3O_{12}$); spessartine ($Mn_3Al_2Si_3O_{12}$); uvarovite ($Ca_3Cr_2Si_3O_{12}$); $Na_3Al_2Li_3F_{12}$; and the like.

In one preferred embodiment, the crystal grown in the iridium-rhenium crucible of this invention is a garnet of the formula $$X_3Z_5O_{12}$$

wherein X is selected from the group consisting of lanthanum, cerium, preseodymium, neodymium, promethium, samarium, europium, gadolinium, terbium, dysprosium, holmium, erbium, thulium, ytterbium, lutetium, and yttrium; and Z is selected from the group consisting of iron, aluminum, gallium and scandium. It is preferred that X be selected from the group consisting of yttrium and gadolinium, and that Z be selected from the group consisting of gallium and aluminum. In one embodiment, the crystal produced is $Gd_3Ga_5O_{12}$ with a refractive index of about 1.97, a dispersion of about 0.045, a density of about 7.02, a hardness of about 7, and a melting point of about 1750° C.; this crystal is about 10 centimeters in diameter, about 30 centimeters in length, and weighs up to about 80,000 carats. In another embodiment, the crystal produced is $Y_3Al_5O_{12}$; it has an optical refractive index of about 1.83, no birefringence, and a dispersion of 0.028.

It is preferred to separately grow single crystals with the iridium-rhenium crucible of this invention using the Czochralski pulling technique. The conditions used in the technique are well known to those skilled in the art. Some of these typical conditions, for some representative crystals, are shown in Table 1; it should be understood, however, that the conditions to be used for any one crystal will vary with crystal size and furnace geometry.

TABLE 1
Conditions for the Growth of Some Crystals

| Crystal | Melting Point °C. | Atmosphere | Pulling Rate mm/h | Rotation Rate rev/min |
|---|---|---|---|---|
| $Y_3Al_5O_{12}$ | 1950 | Nitrogen | 2 | 60 |
| $LiTaO_3$ | 1650 | Nitrogen | 10 | 30 |
| $CaWO_4$ | 1650 | Air | 10 | 100 |
| $MnFe_2O_4$ | 1500 | Nitrogen | 5 | 10 |
| $NaBa_2Nb_5O_{15}$ | 1450 | Oxygen | 5 | 30 |
| $Sr_{0.5}Ba_{0.5}Nb_2O_6$ | 1406 | Oxygen | 5 | 10 |
| $LiNbO_3$ | 1250 | Oxygen | 5 | 30 |
| $ZnWO_4$ | 1200 | Air | 10 | 100 |
| BaClF | 1008 | Nitrogen/Hydrogen | 8 | 85 |
| $Bi_{12}GeO_{20}$ | 930 | Oxygen | 10 | 50 |
| $NaNO_2$ | 271 | Vacuum | * | 70 |
| $Gd_3Ga_5O_{12}$ | 1750 | 98%$O_2$/2%$N_2$ | 1–20 | 5–200 |

*Kyropoulos method crucible cooled at 4 deg C/h

PREPARATION OF GADOLINIUM-GALLIUM GARNET CRYSTAL

In one preferred embodiment of this invention, a single gadolinium gallium garnet ($Gd_3Ga_5O_{12}$) is prepared in a crucible which consists essentially of an alloy comprised of from about 85 to about 99 weight percent of iridium and from about 1 to about 15 weight percent of rhenium. Any of the pure melt growth techniques can be used to grow said single garnet crystal from a crystal melt in said crucible. In one embodiment, the well known Czochralski technique is used.

The Czochralski crystal growth technique is well known to the prior art and is described in: J. Czochralski, Z. Phys. Chem., 1918, 92, 219; K. Nassau and A. M. Broyer, J. Appl. Phys., 1962, 33, 3064; B. Cockayne, Platinum Metals Rev., 1968, 12, 16; B. Cockayne, M. Chesswas and D. b. Gasson, J. Mater. Sci., 1967, 2, 7. Each of these publications is hereby incorporated by reference into this specification.

In the preferred process of this invention, powders of gallium oxide and gadolinium oxide are mixed and then melted in an iridium/rhenium crucible; melting is preferably done using radio frequency energy under an atmosphere of nitrogen and/or a $N_2/O_2$ mixture. A seed from another crystal is dipped into the molten garnet and, as it is slowly withdrawn from the melt, the garnet freezes onto it to form the new crystal.

In this embodiment, it is preferred to heat the metal oxide reactants used to prepare the gadolinium-gallium garnet for a time sufficient to drive off moisture and volatile carbonates. In one embodiment, these reactants are heated at a temperature of from about 100 to about 800° C. until the reactants contain less than about 10 weight percent of moisture.

In this preferred embodiment, gallium oxide and gadolinium oxide are mixed in substantially stoichiometric proportions to prepare a mixture consisting essentially of $Gd_{3+x}Ga_{5-x}O_{12}$, wherein x is from about 0.00 to about 0.07. It is preferred that x be from about 0.00 to about 0.06. It is more preferred that x be from about 0.00 to about 0.05. In general, in the preparation of this mixture, about 0.6 molecules of gadolinium oxide are mixed with each molecule of gallium oxide.

Prior to the time the mixed powders are loaded into the crucible, they can be prereacted in air at a temperature of from about 1200° to about 1500° C. for from about 1 to about 10 hours.

The gallium oxide and gadolinium oxide powders may be charged to the crucible by means well known to those skilled in the art. Thus, for example, one can isostatically compact the mixed powders prior to melting in the crucible. Thus, for example, one can utilize the hot loading technique involving direct sprinkling of the powders into the hot crucible.

Figure 1:
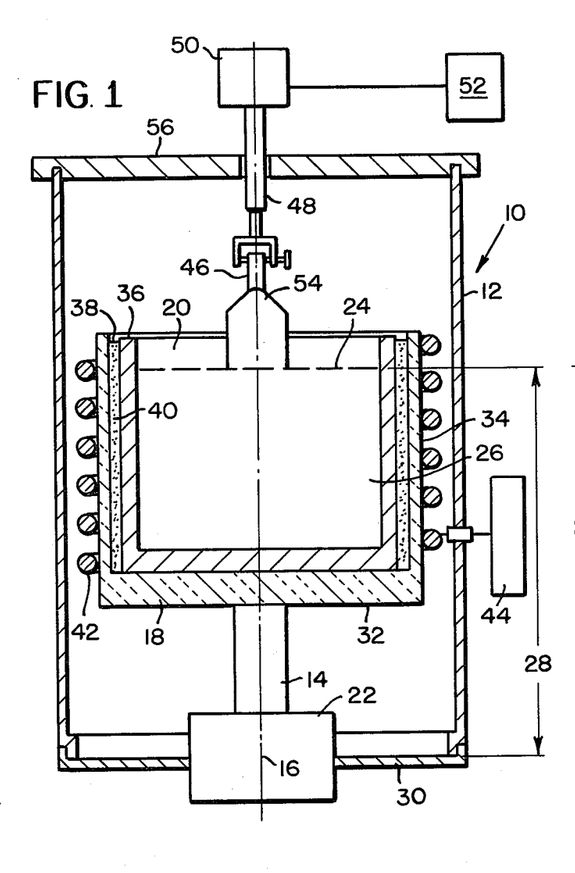
FIG. 1 is a partly schematic view, partly in section and partly in elevation, of one apparatus for growing crystals from a crystal melt by the Czochralski process.
Figure 2:
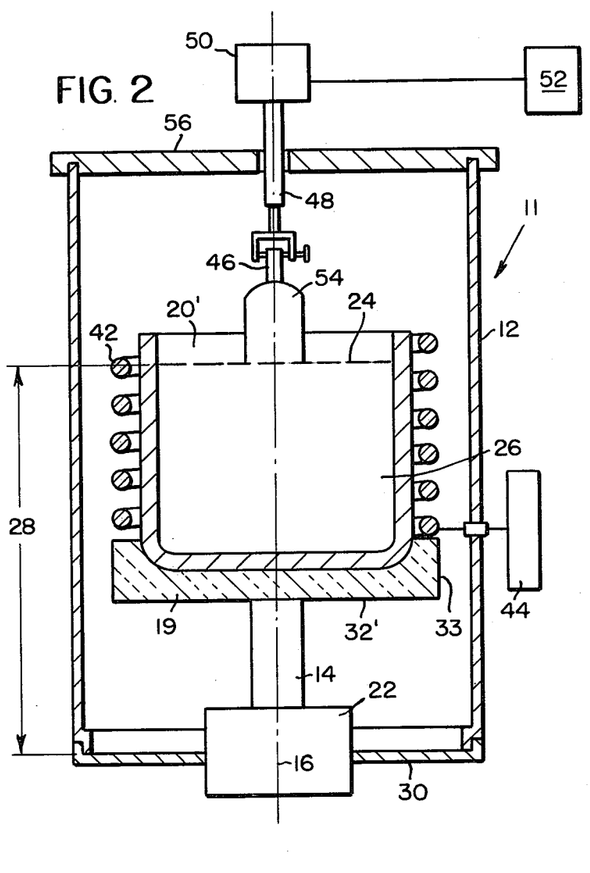
FIG. 2 is a partly schematic view, partly in section and partly in elevation, of another apparatus for growing crystals from a crystal melt by the Czochralski process.

As long as the crucible is comprised of from about 85 to about 99 weight percent of iridium and from about 1 to about 15 weight percent of rhenium, it can be utilized in any prior art configuration for growing a single crystal by the Czochralski process. One such configuration is illustrated in FIGS. 1 and 2, which shows two apparatuses for use in crystal growing. FIG. 1 shows schematically, in vertical section, an apparatus 10 for use in crystal growing. FIG. 2 is similar to FIG. 1, but illustrates another apparatus 11 for use in crystal growing. The apparatuses 10 and 11 include a housing 12 provided with a shaft 14 which extends along a vertical axis 16 of the housing 10 and carries a support 18 or 19 for supporting a crystal melt crucible 20 or 20'. The shaft 14 can be raised and lowered vertically by a drive 22 so that the upper level 24 of a crystal melt 26 in the crucible 20 is kept at a constant distance 28 from a bottom surface 30 of the housing 12. The support 18 includes a bottom plate 32 and a partially circumferentially-extending, thermally-insulating wall 34. A cylindrical vertical wall 36 of the crucible 20 and the insulating wall 34 are spaced apart and together define there between an annular region 38 which is filled with powdered aluminum oxide 40. Heat is generated by a radio frequency induction coil 42, which surrounds the walls and is connected to a high-frequency generator 44. A seed crystal 46 is carried by a vertical drawing rod 48 and lowered into the melt 26. The crystal 46 is then slowly withdrawn by raising, and simultaneously rotating, the rod 48 under the control of a geared motor 50, which is itself controlled by a potentiometer 52. As the crystal 46 is raised out of the melt 26, it draws with it quantities of the melt which form a growing cylindrical crystal 54. A heat shield 56 is employed to prevent the loss of heat from the system.

The apparatus 11 shown in FIG. 2 is largely similar to that of FIG. 1. Indeed, the only real difference is that bottom plate 32' is formed with an annular flange 33 rather than the walls 34.

As will be apparent to those skilled in the art, the configurations illustrated in FIGS. 1 & 2 are representative of only two of many which may be used in the process of this invention with an iridium/rhenium crucible.

In this preferred embodiment for growing gadolinium-gallium-garnet crystal, a substantially inert atmosphere is used to enclose the crystal melt and the crystal growing apparatus. Thus, one can use such inert or slightly oxidizing atmospheres as nitrogen; argon; helium; $CO/CO_2$ mixtures; $N_2/O_2$ mixtures comprised of 95–99.5 volume percent of nitrogen and 0.5 to 5 volume percent of oxygen, and the like. The most preferred growth inert atmosphere is comprised of 98 volume percent of nitrogen and 2 volume percent of oxygen, although lesser and greater amounts of nitrogen and oxygen can be used depending upon furnace considerations such as, e.g., thermal gradients.

Rotation rates will vary according to crystal size. In general a rotation rate of from about 5 to about 200 revolutions per minute can be used. It is preferred to use a rotation rate of from about 10 to about 100 revolutions per minute, and it is even more preferred to use a rotation rate of from about 15 to about 75 revolutions per minute.

Pull rates also will vary according to the size of the crystal being grown. In general, a pull rate of from about 1 to about 20 millimeters per hour is used. It is preferred to use a pull rate of from about 2 to about 15 millimeters per second, and it is more preferred to use a pull rate of from about 3 to about 10 millimeters per hour. Fifty and seventy-five millimeter diameter crystals can be grown as fast as 7.5 millimeters per hour pull rate free of defects, and twenty-five millimeter diameter crystals can be grown at pull rates as fast as 15 millimeters per hour.

The crucible is preferably heated by induction in order to maintain the temperature of the crystal melt at from about 200 to about 2530 degrees centigrade. It is preferred that the melt temperature be maintained at from about 500 to about 2490 degrees centigrade, and the most preferred melt temperature is from about 1000 to about 2400 degrees centigrade. Generators of 10 kiloherz, 50 kiloherz, and standard radio frequency (250–400 kiloherz) can be used.

Some form of automatic diameter control can be employed in growing the gadolinium-gallium-garnet crystals. Some of the more preferred control systems involves weight control of the crystal. These systems are well known to those skilled in the art and are described in, e.g., Keig, G. A.: GGG substrate growth and fabrication, AIP Conference Proceedings No. 10, Magnetism and Materials, New York, American Institute of Physics (1972), p. 237; Kyle, T. R., Zydzik, G.; Automated crystal puller, Mat. Res. Bull 8, 443 (1973); and Valentino, A. J., Brandle, C. D.; Diameter Control of Czochralski-grown crystals, J. Crystal Growth 26, 1 (1974); the disclosures of these publications are hereby incorporated by reference into this specification. In these weight control systems, the weight of either the growing crystal or the crucible is monitored.

After the desired amount of crystal growth has occurred, the crystal can be separated quickly from the melt by rapidly increasing the pull rate, and then the growth furnace can be slowly cooled down to room temperature over several hours. Cooling of the crucible and the residual charge takes less time than growing the crystal and, generally, occurs in from about 5 to about 50 hours.

The crystal rod or boule of garnet which has been separated from the melt is first ground to a specified diameter and then cut into wafers with a diamond-tipped saw. The wafers are then lapped and polished carefully to produce an optimum surface for liquid phase epitaxy. As used in this specification, the term "liquid phase epitaxy" refers to the deposition of a film on a substrate from a complex solution containing the components of the film. The slices are dipped into another melt contained in a special crucible, such as a platinum crucible, having the necessary ingredients to grow epitaxially a defect-free magnetic garnet film (such as yttrium samarium iron gallium garnet) on the surface.

APPARATUS FOR TESTING THE COMPATABILITY OF THE IRIDIUM/RHENIUM CRUCIBLE WITH THE GADOLINIUM-GALLIUM-GARNET

The iridium-rhenium crucible of this invention is substantially more compatible with the gadolinium-gallium-garnet melt than comparable iridium or iridium-tungsten crucibles.

Figure 3:
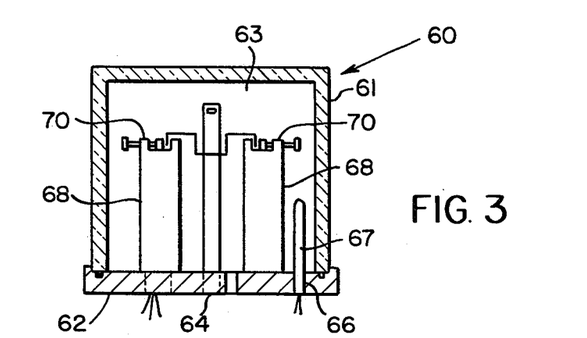
FIG. 3 is an isometric view partly broken away and partly in cross-section of a test unit used to determine the compatibility of various alloys with a gadolinium-gallium-garnet crystal.

FIG. 3 is a cross-sectional view of a test unit used to determine the compatibility of various alloys with gadolinium-gallium-garnet crystal. Compatibility testing was carried out in an Abar Micro Bar resistance heating unit 60 manufactured by the Abar Corporation of Feasterville, Pa. The testing device 60 comprises a glass bell jar 61 seated on a sealing groove in base 62 to enclose a testing chamber 63. The testing device 60 includes an inlet for introducing a controlled inert atmosphere into the testing chamber 63. The testing device 60 also includes a thermocouple port 66 through which a thermocouple device 67 is inserted into the test chamber 63, two power terminal ports 68, and two element clamps 70. The alloy samples to be tested are clamped into place by clamp 70 in contact with gadolinium-gallium-garnet crystal, the alloy-crystal sample is blanketed with an inert gas (such as, e.g.. 98% $N_2/2\%$ $O_2$), the alloy-crystal sample is heated to the melting point of gadolinium-gallium-garnet (1750° F.) for a period of 60 minutes. Thereafter the gadolinium-gallium-garnet crystal samples are cooled to 25° C. over a period of 10-15 minutes and then examined for signs of contamination.

APPARATUS FOR TESTING THE CREEP-RESISTANCE OF THE IRIDIUM/RHENIUM CRUCIBLES

The iridium/rhenium crucible of this invention has substantially more creep resistance than a comparable iridium crucible.

The creep resistance of the iridium/rhenium alloy used in the crucible of this invention was measured in a horizontal electrical furnace capable of achieving a temperature of about 1800° C. The heating elements of the furnace were wound on an oval shaped alumina tube having internal dimensions of ½ inch × ¼ inch. The total furnace length was 12 inches. Furnace temperature control was accomplished by a West 800 on-off controller, manufactured by the West Corporation of Chicago, Ill. The temperature was monitored with a thermocouple on the reduced section of the specimen. Static loads were suspended from the specimen to effect creep at temperature. Creep was measured by means of a linear voltage differential transformer (manufactured by Applied Test Systems Co. of Saxonburg, Pa.). The test specimens were cut on a Tensil Kut machine manufactured by Siebert Industries of Danbury, Conn.; this device cut test specimens of 2.00 inch guage length, approximately 0.125 inches wide in a 0.250 wide by 0.020 inch thick sample. Tests were carried out in air at 1600° and 1700° C. at a static load of 1 kilogram/square millimeter.

Figure 4:
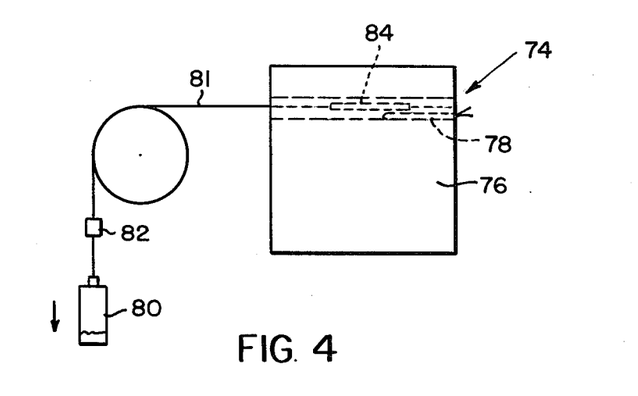
FIG. 4 is a schematic representation of an apparatus used to test the creep resistance of an alloy.

FIG. 4 is a schematic representation of a creep testing apparatus 74. The apparatus 74 comprises a horizontal electric furnace 76 whose internal temperature is monitored by a thermocouple 78. A weight 80 is connected by a wire (or string) 81 through a linear voltage differential transformer 82 to a sample 84 held stationary at one end thereof by a support in the furnace. As the test sample 84 is subjected to heat and stress, the creep is measured by measuring the displacement of the iron core within the LVDT coil 82.

Figure 5:
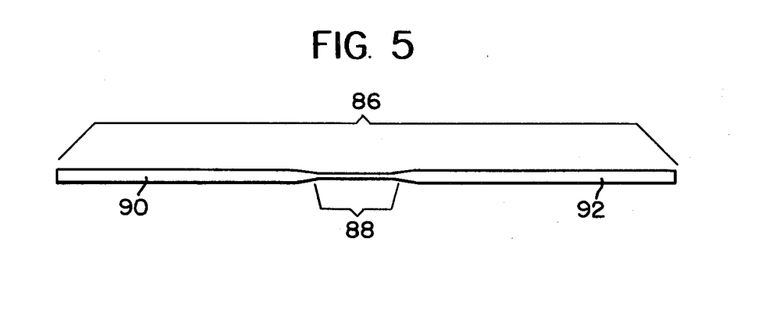
FIG. 5 is a cross-section of the alloy test sample used in the apparatus of FIG. 4.

FIG. 5 is a cross section of the creep test sample. The test specimen has an overall length 86 of 16.0 inches. Its middle gauge section 88 is 2.0 long by 0.125 inches wide. The remaining two sections 90 and 92 of the sample are each about 7.0 inches long and about 0.250 inches wide.

Figure 6:
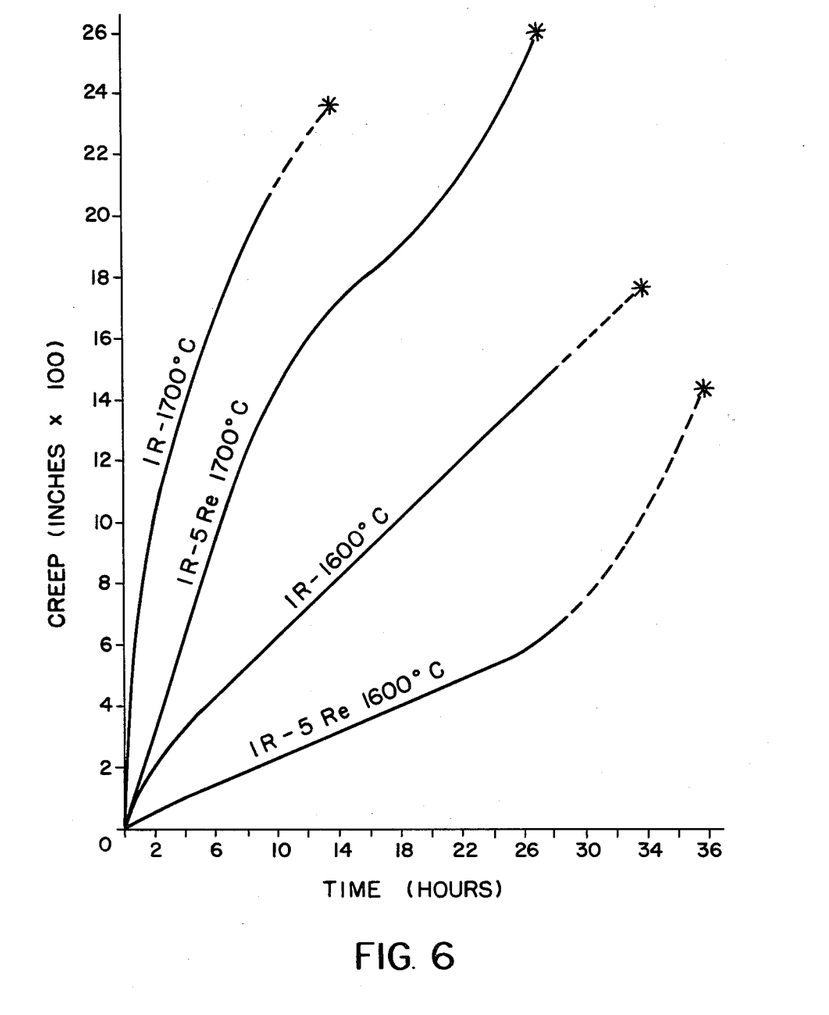
FIG. 6 is a graph of the results obtained from the creep resistance testing of iridium and iridium-rhenium samples.

FIG. 6 is a graph of the results obtained from the creep resistance testing of iridium and iridium-rhenium samples.

CRUCIBLE PROPERTIES

The melting point of the crucible of this invention is from about 2450° to about 2515° C.; the more rhenium which is in the alloy of the crucible, the higher the melting point. By comparison, when tungsten is alloyed with iridium, the melting point of the alloy decreases with increasing tungsten concentration. A comparison of the melting points of iridium-metal alloys wherein the metal is either tungsten or rhenium and the alloy is comprised of either 5, 10, 15, or 20 percent of the metal is presented in Table 2.

TABLE 2

| Percent of Metal in Iridium-Metal Alloy | Melting Point of Alloy Where the Metal is Tungsten | Melting Point of the Alloy Where the Metal is Rhenium |
|---|---|---|
| 0 | 2447° C. | 2447° C. |
| 5 | 2414° C. | 2469° C. |
| 10 | 2380° C. | 2492° C. |
| 15 | 2345° C. | 2515° C. |
| 20 | 2309° C. | 2538° C. |

In one of the preferred embodiments of this invention, yttrium-aluminum-garnet is prepared by the Czochralski process by reacting yttrium oxide ($Y_2O_3$) and aluminum oxide. In a typical process, a crystal about 5 cm diameter by about 20 cm long weighing about 9000 carats is produced using a pulling speed of about 5 mm per hour with a crystal rotation of 20 revolutions per minute at a melt temperature of from about 1980°-2540° C.

The crucible of this invention can be of any shape and size. Thus, by way of illustration and not limitation, the crucible may be any of the sizes listed in Table 3. In this Table 3, illustrative crucible Types 1-4 are shown; D is the diameter of the crucible, H is the height, W is the thickness of the vertically-extending crucible sidewalls, and B is the thickness of the horizontally-extending crucible base-wall; and all dimensions are expressed in millimeters.

TABLE 3

| Type | Dimension, mm | | | |
|---|---|---|---|---|
| | D | H | W | B |
| 1 | 40 | 40 | 1.6 | 1.6 |
| 2 | 60 | 60 | 1.6 | 1.6 |
| 3 | 60 | 85 | 1.6 | 1.6 |
| 4 | 100 | 100 | 2.0 | 2.0 |

As is well known to those skilled in the art, other shapes and sizes also can be used.

The following examples are presented to illustrate the claimed invention and are not to be deemed limitative thereof. Unless otherwise stated, all parts are by weight and all temperatures are in degrees centigrade.

EXAMPLE 1

0.5 ounces of rhenium powder and 9.5 ounces of iridium powder were charged to a one-quart glass jar and were blended for 80 hours in a roll mill rotary blender manufactured by the U.S. Stoneware Company of Akron, Ohio. Thereafter, the 10 ounce powder mixture so obtained was placed in an open-ended, rectangular rubber sack with a thickness of approximately 0.5 inches. The powder mixture was then hydrostatically pressed at a pressure of 25,000 pounds per square inch for 60 seconds into briquette form by a press manufactured by Autoclave Engineers of Erie, Pa. The briquette was then sintered at a temperature of 1600° C. in a vacuum of $1 \times 10^{-4}$ Torr for 4 hours. The sintered bar was then heated to 1600° C. and hot rolled to a sheet which was 0.125" thick, 3.0" wide, and 9.0" long. This sheet was then formed into a cylinder which was 3.0" high and 3.0" in diameter. The formed cylinder was joined at the seam by using a tungsten-inert gas welding process with a 95%/5% iridium/rhenium filler rod. A bottom for the crucible to be formed was punched from a second 95%/5% iridium/rhenium sheet which was 0.125" thick by 3.0" wide by 9.0" long; the coupon for the crucible bottom was 0.125" thick with a 2.75" diameter. The bottom coupon was welded to the 3.0"×3.0" cylinder using said tungsten-inert gas welding process with the 95%/5% iridium/rhenium filler rod.

EXAMPLE 2

In substantial accordance with the procedure of Example 1, a sintered briquette comprised of 0.5 ounces of rhenium powder and 9.5 ounces of iridium powder was prepared. This sintered briquette was then placed in a water-cooled copper hearth the center of which had been indented such that the metal powder, when molten, would assume the shape of a 2"×2" square which was 3/16" thick. Thereafter, the furnace chamber was evacuated to a pressure of $20 \times 10^{-3}$ Torr and back filled with argon to 15 p.s.i.g. The briquette was arc melted using a Hobard AC-DC motor-generator with a maximum output of 40 volts/400 amperes direct current; melting was accomplished in about 1 minute. The square button thus produced was then permitted to cool, the furnace was opened and the button was inverted, the furnace was evacuated again to a pressure of $20 \times 10^{-3}$ Torr, and the button was melted again as described above to insure a complete and homogenous melt.

EXAMPLE 3

The procedure of Example 1 was substantially followed to prepare a 0.125" thick hot rolled sheet comprised of 10 weight percent of rhenium and 90 weight percent of iridium. 1.0 ounces of rhenium powder and 9.0 ounces of iridium powder were used as the charge to the one-quart glass jar.

EXAMPLE 4

The procedure of Example 1 was substantially followed to prepare a 0.125" thick hot rolled sheet comprised of 10 weight percent of tungsten and 90 weight percent of iridium. 1.0 ounces of tungsten powder and 9.0 ounces of iridium powder were used as the charge to the one-quart glass jar.

EXAMPLE 5

The procedure of Example 1 was substantially followed to prepare a 0.125" thick hot rolled sheet comprised of 100 weight percent of iridium. 10 ounces of iridium powder were placed in said open-ended, tubular sack, the iridium powder was then hydrostatically pressed at a pressure of 25,000 pounds per square inch for 60 seconds to form a briquette, the briquette was sintered at a temperature of 1600° C. in a vacuum of $1 \times 10^{-4}$ Torr for 4 hours, and the sintered briquette was then heated to 1600° C. and hot rolled to a sheet which was 0.125" thick.

EXAMPLES 6-7

A 0.125" thick hot rolled sheet comprised of 5 weight percent of rhenium and 95 weight percent of iridium was prepared in substantial accordance with the procedure of Example 1. A 0.125" thick hot rolled sheet comprised of 100 weight percent of iridium was prepared in substantial accordance with the procedure of Example 5. Test specimens from these sheets were cut on a Tensil Kut machine (manufactured by Siebert Industries of Danbury, Conn.; this device cut a 2.00 inch gage length, approximately 0.125 inches wide in a 0.250 inch wide by 0.020 inch thick starting sample. These test samples were used to determine the creep resistance of the 95%/5% and 100%/0% iridium/rhenium compositions.

The creep resistance of the samples was measured in a horizontal electric furnace capable of achieving a temperature of about 1800° C. The heating elements of the furnace were wound on an oval shaped alumina tube having internal dimensions of ½ inch×¼ inch. The total furnace length was 12 inches. Furnace temperature control was accomplished by a West 800 on-off controller manufactured by the West Corporation of Chicago, Ill. The temperature was monitored with a thermocouple on the reduced section of the specimen. A static load of 1 kilogram/square millimeter (1420 p.s.i.) was suspended from the specimen to effect creep at a specified temperature. Creep was measured by a linear voltage differential transformer manufactured by Applied Test Systems Co. of Saxonburg, Pa. FIG. 3 is a schematic representation of the creep testing apparatus. FIG. 4 is a cross section of the creep test sample.

Tests were conducted on the iridium and the iridium-rhenium samples at both 1600° and 1700° C. The results obtained are shown in FIG. 6. At 1600° C., the iridium sample ruptured after 33.1 hours of testing and the iridium/rhenium sample ruptured after 39.4 hours of testing. At 1700° C., the iridium sample ruptured after 12.9 hours of testing and the iridium/rhenium sample ruptured after 28.3 hours of testing.

EXAMPLES 8-11

In accordance with the procedures of Examples 5, 3, and 4, 0.125" wide sheets of 100% iridium, 90% iridium/10% rhenium, and 90% iridium/10% tungsten, respectively, were prepared. Dogbone samples from each of these sheets were prepared; these samples were 1/16" wide at the dogbone section.

Gadolinium-gallium-garnet crystal with the following specifications was prepared:

| | |
|---|---|
| Refraction index | 97 |
| Dispersion | 0.045 |
| Density (gm.s/c.m.$^2$) | 7.02 |
| Hardness | 7 |
| Melting point | 1750° C. |

Samples of the gadolinium-gallium-garnet crystal which were ⅛" wide by 0.030" thick were prepared and placed on the dogbone shaped specimen of the iridium, iridium/rhenium, and iridium tungsten samples.

The metal(s)-crystal test samples were tested in the test unit depicted in FIG. 3 in order to determine the compatibility of the metal(s) with gadolinium-gallium-garnet crystal. An Abar Micro Bar resistance heating unit, which was manufactured by the Abar Corporation of Feasterville, Pa., was used. Each sample was placed in the test unit in contact with gadolinium-gallium-garnet crystal. Then power was applied, and the specimen was heated to the melting point of the gadolinium-gallium-garnet crystal (1750° C.) until the garnet sample melted while a cover gas comprised of 98 volume percent of nitrogen and 2 volume percent of oxygen was pumped through the testing device; these reaction conditions were maintained for 60 minutes. Thereafter, the gadolinium-gallium-garnet crystal was cooled to 25° C. over a period of 10-15 minutes and then examined.

The gadolinium-gallium-garnet tested on the iridium support was slightly cloudy, indicating some contamination from the iridium. The gadolinium-gallium-garnet tested on the iridium-tungsten support was black and not at all transparent, indicating a substantial amount of contamination from the iridium-tungsten. However, the gadolinium-gallium-garnet sample tested on the iridium-rhenium support was crystal clear.

It is unexpected that rhenium, which is next to tungsten in the periodic table, has a substantially different effect than tungsten upon the compatibility of iridium with gadolinium-gallium-garnet.

This invention has been described in detail with particular reference to the preferred embodiments thereof, but it will be understood that variations and modifications can be effected within the spirit and scope of the invention as described hereinafter and as defined in the appended claims; these variations and modifications are intended to be comprehended within the scope of this invention.

We claim:

1. A crucible for growing crystal, said crucible consisting essentially of an iridium-rhenium alloy wherein said alloy is comprised of from about 85 to about 99 parts by weight of iridium and from about 1 to about 15 parts by weight of rhenium.

2. The crucible as recited in claim 1, wherein said crucible has a melting point of from about 2450 to about 2540 degrees centigrade.

3. The crucible as recited in claim 2, wherein said alloy is comprised of from about 90 to about 95 parts by weight of iridium and from about 5 to about 10 parts by weight of rhenium.

4. The crucible as recited in claim 2, wherein said alloy consists essentially of from about 85 to about 99 parts by weight of iridium and from about 1 to about 15 parts by weight of rhenium.

5. The crucible as recited in claim 2, wherein said alloy consists essentially of from about 90 to about 95 parts by weight of iridium and from about 5 to about 10 parts by weight of rhenium.

* * * * *